(12) United States Patent
Kim

(10) Patent No.: US 7,855,405 B2
(45) Date of Patent: Dec. 21, 2010

(54) THIN FILM TRANSISTOR AND DISPLAY PANEL HAVING THE SAME

(75) Inventor: Sung-Hoon Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 251 days.

(21) Appl. No.: 12/157,007

(22) Filed: Jun. 5, 2008

(65) Prior Publication Data
US 2008/0308803 A1 Dec. 18, 2008

(30) Foreign Application Priority Data
Jun. 14, 2007 (KR) .................. 10-2007-0058421

(51) Int. Cl.
*H01L 29/76* (2006.01)
(52) U.S. Cl. .................. 257/288; 257/E33.065; 257/E29.113
(58) Field of Classification Search .................. 257/59, 257/288, E33.065, E29.113
See application file for complete search history.

(56) References Cited

U.S. PATENT DOCUMENTS

| 5,811,846 | A * | 9/1998 | Miura et al. ................ 257/291 |
| 2005/0162579 | A1 * | 7/2005 | Jeong et al. ................ 349/43 |

FOREIGN PATENT DOCUMENTS

| JP | 6-67199 | 3/1994 |
| JP | 2002-190605 | 7/2002 |
| JP | 2004-274050 | 9/2004 |
| JP | 2005-134504 | 5/2005 |

OTHER PUBLICATIONS

Patent Abstracts of Japan, Publication No. 06-067199, Mar. 11, 1994, 1 p.
Patent Abstracts of Japan, Publication No. 2002-190605, Jul. 5, 2002, 1 p.
Patent Abstracts of Japan, Publication No. 2004-274050, Sep. 30, 2004, 1 p.
Patent Abstracts of Japan, Publication No. 2005-134504, May 26, 2005, 1 p.

* cited by examiner

*Primary Examiner*—Zandra Smith
*Assistant Examiner*—Jamie Niesz
(74) *Attorney, Agent, or Firm*—Innovation Counsel LLP

(57) ABSTRACT

A thin film transistor includes a gate part which includes a gate electrode and a light blocking electrode extending from the gate electrode. The light blocking electrode prevents a light provided from beneath the gate electrode from being guided to a semiconductor layer. The light blocking electrode is overlapped by two source electrodes and a drain electrode arranged between the two source electrodes, all of which have an I-shape. The width of the light blocking electrode is selected so that a parasitic capacitance between a source part and the gate part may be controlled. Thus, a photocurrent of the thin film transistor may be reduced, and a kickback voltage difference between pixels in the display panel may also be reduced.

20 Claims, 8 Drawing Sheets

THIN FILM TRANSISTOR AND DISPLAY PANEL HAVING THE SAME

CROSS-REFERENCE TO RELATED APPLICATION

This application claim priority from Korean Patent Application No. 10-2007-058421 filed in the Korean Intellectual Property Office on Jun. 14, 2007, the contents of which are herein incorporated by reference in its entirety.

BACKGROUND OF THE INVENTION

1. Field of the Invention

The present invention relates to a thin film transistor and a display panel having the thin film transistor. More particularly, the present invention relates to a thin film transistor capable of improving a display quality and a display panel having the thin film transistor.

2. Description of the Related Art

In general, a liquid crystal display includes an array substrate, an opposite substrate facing the array substrate, and a liquid crystal layer interposed between the array substrate and the opposite substrate to display an image.

The array substrate includes a plurality of gate lines, a plurality of data lines, and a plurality of pixels connected to the gate lines and the data lines. Each pixel includes a thin film transistor and a pixel electrode.

The thin film transistor plays an important role to decide a display quality of each pixel. That is, a response speed and a brightness of the pixels depend on a structure of the thin film transistor.

SUMMARY OF THE INVENTION

The present invention provides a thin film transistor for a display panel, capable of improving a display quality of the display panel.

The present invention also provides a display panel having the thin film transistor.

In one aspect of the present invention, a thin film transistor includes a gate part, a gate insulating layer, a semiconductor layer, a source part, and a drain part. The gate part includes a gate electrode and a light blocking electrode extended from the gate electrode, and the gate insulating layer covers the gate part. The semiconductor layer is arranged on the gate insulating layer corresponding to a region in which the gate electrode is formed. The source part is arranged on the semiconductor layer and intersected with the gate electrode and the light blocking electrode. The drain part is also intersected with the gate electrode and the light blocking electrode and spaced apart from the source part by a predetermined distance.

In another aspect of the present invention, a display panel includes a first base substrate, a plurality of data lines arranged on the first base substrate, a plurality of gate lines intersecting with the data lines to define a plurality of pixel areas, a plurality of thin film transistors arranged in the pixel areas, a plurality of pixel electrodes arranged in the pixel areas and connected to a corresponding thin film transistor, and a second base substrate facing the first base substrate.

Each thin film transistor includes a gate part, a gate insulating layer, a semiconductor layer, a source part, and a drain part. The gate part includes a gate electrode and a light blocking electrode extended from the gate electrode, and the gate insulating layer covers the gate part. The semiconductor layer is arranged on the gate insulating layer corresponding to a region in which the gate electrode is formed. The source part is arranged on the semiconductor layer and overlapped with the gate electrode and the light blocking electrode. The drain part is overlapped with the gate electrode and the light blocking electrode and spaced apart from the source part by a predetermined distance.

According to the above, a photocurrent of the thin film transistor may be decreased due to the light blocking electrode. Since the source electrode and the drain electrode have the I-shape on the gate electrode, a kickback voltage difference between pixels in the display panel may be decreased.

BRIEF DESCRIPTION OF THE DRAWINGS

The above and other advantages of the present invention will become readily apparent by reference to the following detailed description when considered in conjunction with the accompanying drawings wherein.

DESCRIPTION OF THE EMBODIMENTS

Figure 1:
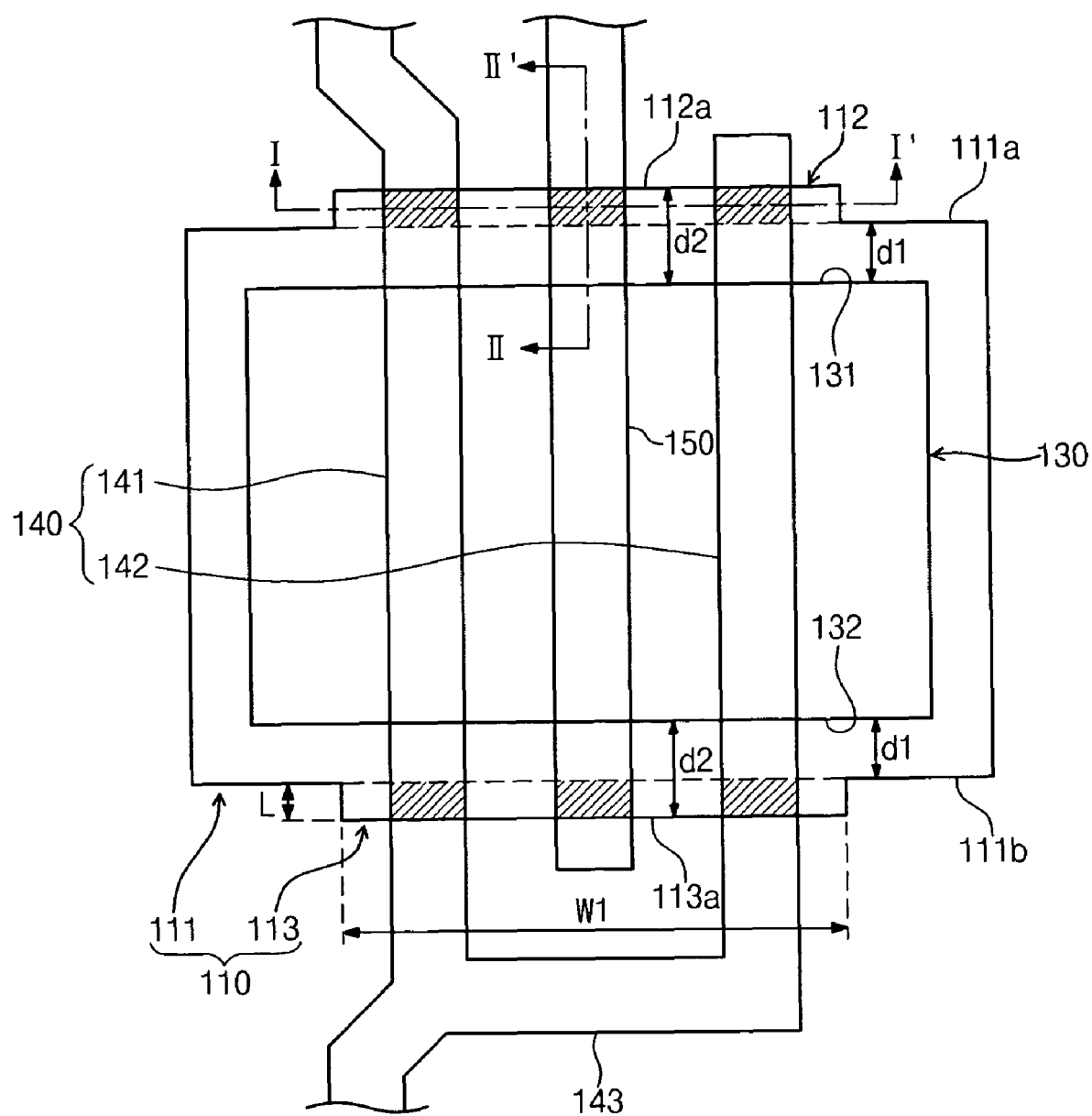
FIG. 1 is a plan view showing an exemplary embodiment of a thin film transistor according to the present invention.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention is explained in detail with reference to the accompanying drawings.

Figure 2:
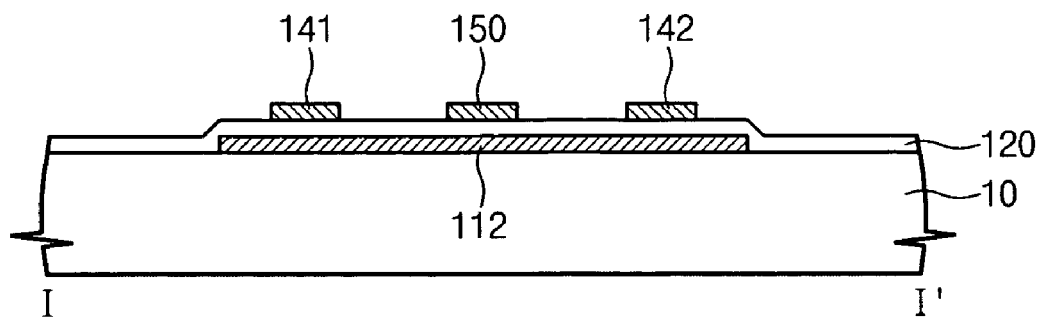
FIG. 2 is a sectional view taken along a line I-I' of FIG. 1.

FIG. 1 is a plan view showing an exemplary embodiment of a thin film transistor according to the present invention, and FIG. 2 is a sectional view taken along a line I-I' of FIG. 1.

Referring to FIGS. 1 and 2, a thin film transistor 100 is arranged on a base substrate 10 and includes a gate part 110, a gate insulating layer 120, a semiconductor layer 130, a source part 140, and a drain part 150.

The gate part 110 includes a gate electrode 111, and a first light blocking electrode 112 and a second light blocking electrode 113 that are extended from the gate electrode 111. The gate electrode 111 has a square shape when viewed in a plan view, and the first and second light blocking electrodes 112 and 113 are outwardly extended from a first side 111a and a second side 111b of the gate electrode 111, respectively. The first side 111a and the second side 111b of the gate electrode 111 are arranged in parallel to each other. The first and second light blocking electrodes 112 and 113 are extended from the first and second sides 111a and 111b of the gate electrode 111 by a predetermined length L, respectively, and each of the first and second light blocking electrodes 112 and 113 has a width W that is equal to or smaller than a length of each of the first and second sides 111a and 111b. In the present exemplary embodiment, each of the first and second light blocking electrodes 112 and 113 has a width that is smaller than the length of each of the first and second sides 111a and 111b in FIG. 1.

Figure 3:
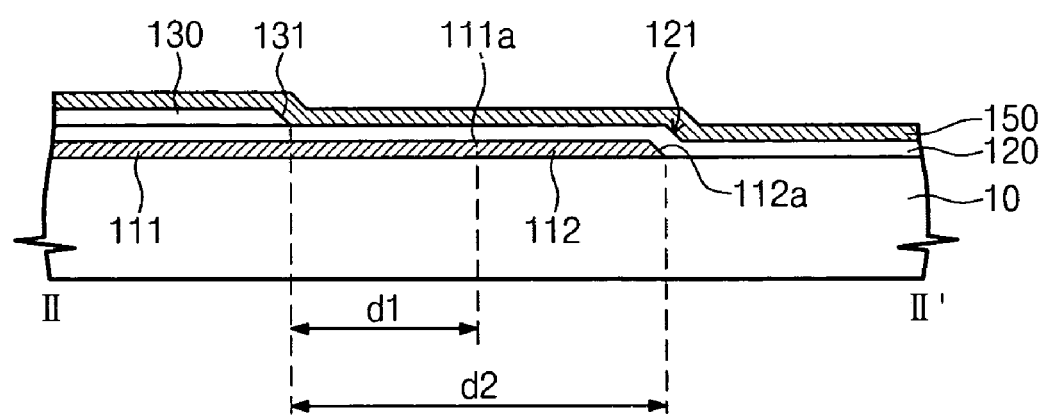
FIG. 3 is a sectional view taken along a line II-II' of FIG. 1.

The base substrate 10 is provided with a gate insulating layer 120 shown in FIG. 3 in order to cover the gate electrode 111, the first light blocking electrode 112, and the second light blocking electrode 113. A semiconductor layer 130 is formed on the gate insulating layer 120 corresponding to a region in which the gate electrode 111 is formed. As an example of the present embodiment, the semiconductor layer 130 includes amorphous silicon.

Also, the semiconductor layer 130 has a smaller size than a size of the gate electrode 111 in a plan view. Thus, when viewed in a plan view, a third side 131 and a fourth side 132 of the semiconductor layer 130 arranged in parallel with the first and second sides 111a and 111b of the gate electrode 111 are spaced apart from the first and second sides 111a and 111b by a first distance d1, respectively.

Meanwhile, when viewed in a plan view, the third side 131 of the semiconductor layer 130 is spaced apart from a first side 112a of the first light blocking electrode 112 by a second distance d2, and the fourth side 132 of the semiconductor layer 130 is spaced apart from a second side 113a of the second light blocking electrode 113 by the second distance d2. The second distance d2 is greater than the first distance d1. In the present exemplary embodiment, the first distance d1 is about 4 μm, and the second distance d2 is in a range of about 7 μm to about 8 μm. Accordingly, the first and second light blocking electrodes 112 and 113 are extended from the first and second sides 111a and 111b of the gate electrode 111 by about 3 μm to about 4 μm, respectively.

The source part 140 and the drain part 150 are arranged on the gate insulating layer 120 and the semiconductor layer 130.

The source part 140 includes a first source electrode 141 and a second source electrode 142 that are spaced apart from each other by a predetermined distance and extended in parallel to each other on the gate part 110. As shown in FIG. 1, the first and second source electrodes 141 and 142 are extended in a direction that is substantially perpendicular to the first and second sides 111a and 111b of the gate electrode 111 to be intersected with the gate electrode 111, the first light blocking electrode 112, and the second light blocking electrode 113. Thus, in a plan view, the first and second source electrodes 141 and 142 are partially overlapped with the semiconductor layer 130 and the gate electrode 111, and also partially overlapped with the first and second light blocking electrodes 112 and 113.

The first and second source electrodes 141 and 142 are spaced apart from each other in a direction that is substantially parallel to the first and second sides 111a and 111b of the gate electrode 111 by a predetermined distance. Thus, the source part 140 further includes a connecting electrode 143 that electrically connects the first source electrode 141 to the second source electrode 142. The connecting electrode 143 is arranged in a peripheral area of the gate part 110. Thus, the connecting electrode 143 is spaced apart from the gate electrode 111 and the second light blocking electrode 113 when viewed in a plan view, so that the connecting electrode 143 is not overlapped with the gate electrode 111 and the first and second light blocking electrodes 112 and 113.

The drain part 150 includes a drain electrode interposed between the first source electrode 141 and the second source electrode 142. The drain electrode 150 is extended in a direction that is substantially perpendicular to the first and second sides 111a and 111b of the gate electrode 111 to be intersected with the gate electrode 111, the first light blocking electrode 112, and the second light blocking electrode 113. That is, in a plan view, the drain electrode 150 is partially overlapped with the semiconductor layer 130 and the gate electrode 111, and also partially overlapped with the first and second light blocking electrodes 112 and 113.

As shown in FIG. 1, the drain electrode 150, the first source electrode 141, and the second source electrode 142 have an I-shape on the gate part 110. Thus, although an overlay difference of the drain electrode 150, the first source electrode 141, and the second source electrode 141 and 142 occurs, an overlap area between the gate electrode 111 and the source part 140 and between the gate electrode 111 and the drain part 150 is not changed. Thus, a kickback voltage difference between pixels caused by the overlay difference in a display panel may be prevented, and a brightness difference in the display panel may be reduced.

FIG. 3 is a sectional view taken along a line II-II' of FIG. 1.

Referring to FIG. 3, the first light blocking electrode 112 is extended from the first side 111a of the gate electrode 111 that is intersected with the drain electrode 150. Thus, the third side 131 of the semiconductor layer 130 and the first side 112a of the first light blocking electrode 112 are spaced apart from each other by the second distance d2 that is greater than the first distance d1 in a region in which the drain electrode 150 is arranged.

A slanting side 121 is formed on the gate insulating layer 120 due to a step-difference between the first light blocking electrode 112 and the base substrate 10. Thus, a light provided through a lower portion of the base substrate 10 is reflected by the slanting side 121 of the gate insulating layer 120, and the reflected light may be guided to the semiconductor layer 130. However, since the third side 131 of the semiconductor layer 130 and the first side 112a of the first light blocking electrode 112 are spaced apart from each other by the second distance d2 that is greater than the first distance d1, the reflected light may be entirely diminished before the light could reach the semiconductor layer 130 or a path of the light may be changed due to re-reflection off of the gate electrode 111.

Although not shown in figures, due to the above described reason, the light may be prevented from being guided to the semiconductor layer 130 in a region in which the second light blocking electrode 113 (shown in FIG. 1) is formed.

Since the first and second light blocking electrodes 112 and 113 arranged on the gate part 110 increases the distance between the semiconductor layer 130 and the slanting side 121 of the gate insulating layer 120, the light may be prevented from being input to the semiconductor layer 130, so that a photocurrent of the thin film transistor 100 (shown in FIG. 1) may be reduced.

Figure 4:
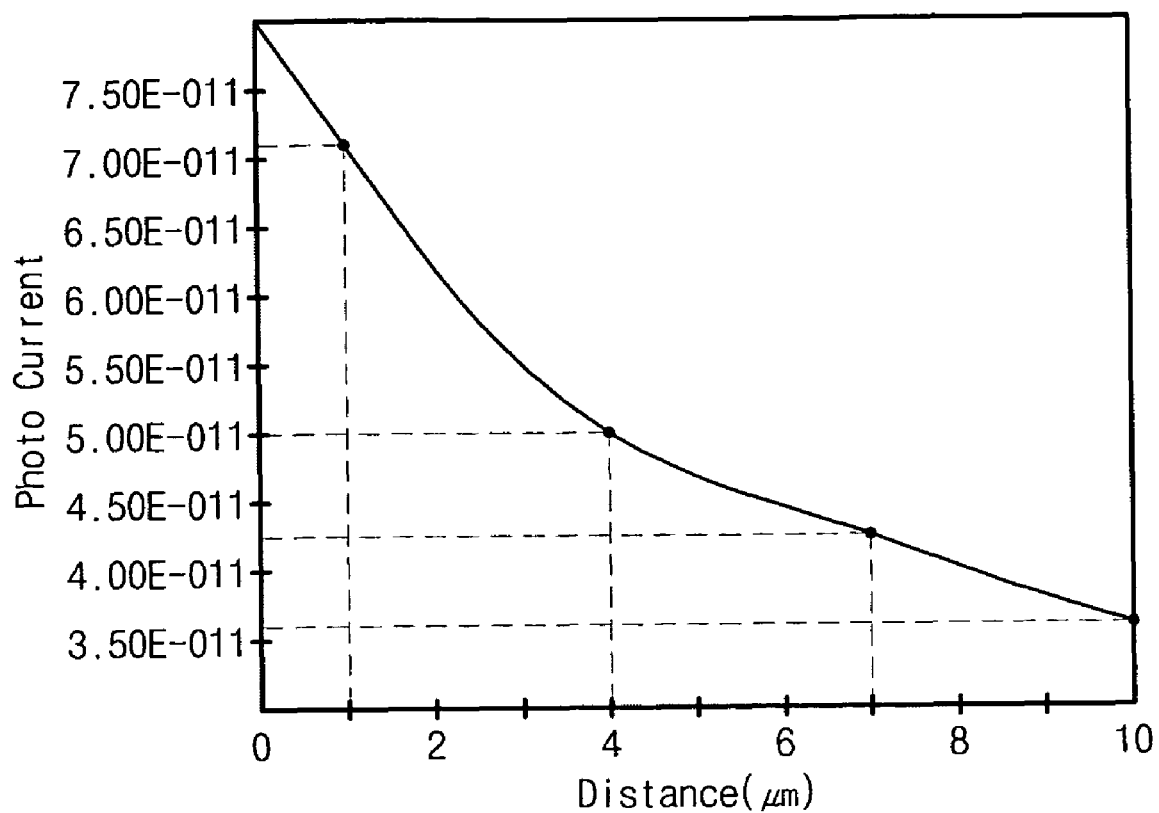
FIG. 4 is a plot showing a photocurrent as a function of distance.

FIG. 4 is a plot of photocurrent as a function of distance. In FIG. 4, the x-axis represents a horizontal distance between edge 131 of the semiconductor layer 130 and edge 112a of the gate part 110 adjacent to the semiconductor layer 130, and y-axis represents a photocurrent of the thin film transistor 100.

Referring to FIG. 4, when the horizontal distance between the semiconductor layer 130 and the edge of the gate part 110 adjacent to the semiconductor layer 130 decreases, the photocurrent of the thin film transistor 100 increases, and when the horizontal distance between the semiconductor layer 130 and the edge of the gate part 110 adjacent to the semiconductor layer 130 increases, the photocurrent of the thin film transistor 100 decreases.

In a conventional structure where the first and second light blocking electrodes 112 and 113 are not extended from the first and second sides 111a and 111b of the gate electrode 111, respectively, when the horizontal distance between the semiconductor layer 130 and the edge of the gate part 110 adjacent to the semiconductor layer 130 is about 4 µm, the photo current of the thin film transistor 100 is about 5.00E-011. However, in the present exemplary embodiment where the first and second light blocking electrodes 112 and 113 are extended from the first and second sides 111a and 111b of the gate electrode 111, respectively, when the horizontal distance between the semiconductor layer 130 and the edge of the gate electrode 110 adjacent to the semiconductor layer 130 is about 7 µm, the photocurrent of the thin film transistor 100 is about 4.02E-011, which shows a decrease compared to the conventional structure.

Accordingly, the first and second light blocking electrodes 112 and 113 that are respectively extended from the first and second sides 111a and 111b of the gate electrode 111 may reduce the photocurrent of the thin film transistor 100.

Figure 5:
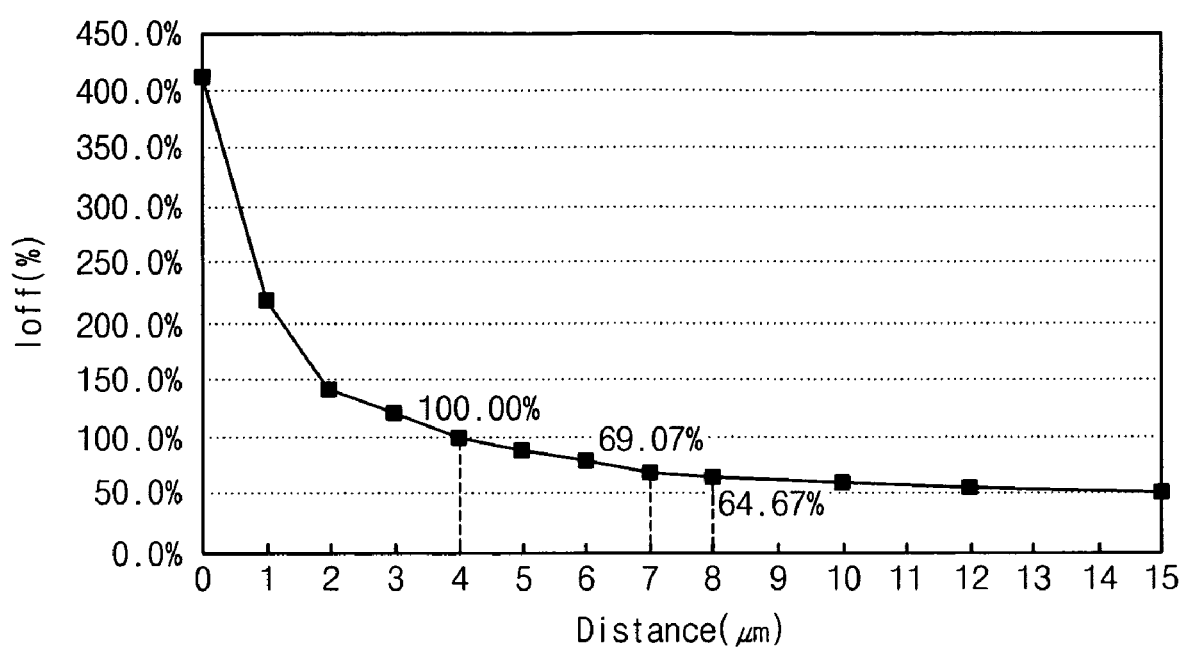
FIG. 5 is another plot showing a photocurrent as a function of distance.

FIG. 5 is another plot showing a photocurrent as a function of distance. In FIG. 5, an x-axis represents a horizontal distance between the edge 131 of the semiconductor layer 130 and the edge 112a of the gate part 110 adjacent to the semiconductor layer 130, and a y-axis represents a photocurrent of the thin film transistor 100 in percent. In FIG. 5, in the conventional structure where the first and second light blocking electrodes 112 and 113 are not extended from the first and second sides 111a and 111b of the gate electrode 111, respectively, when the horizontal distance between the edge the semiconductor layer 130 and the edge of the gate part 110 adjacent to the semiconductor layer 130 is about 4 µm, the photocurrent of the thin film transistor 100 is defined as 100%.

Referring to FIG. 5, in the present exemplary embodiment where the first and second light blocking electrodes 112 and 113 are extended from the first and second sides 111a and 111b of the gate electrode 111, respectively, when the horizontal distance between the semiconductor layer 130 and the edge of the gate electrode 110 adjacent to the semiconductor layer 130 is about 7 µm, the photocurrent of the thin film transistor 100 is about 69.07%, which shows a decrease compared to the conventional structure.

In the present exemplary embodiment where the first and second light blocking electrodes 112 and 113 are extended from the first and second sides 111a and 111b of the gate electrode 111, respectively, when the horizontal distance between the semiconductor layer 130 and the edge of the gate electrode 110 adjacent to the semiconductor layer 130 is about 8 µm, the photocurrent of the thin film transistor 100 is about 64.67%, which shows a decrease compared to the conventional structure.

Accordingly, the first and second light blocking electrodes 112 and 113 that are respectively extended from the first and second sides 111a and 111b of the gate electrode 111 may reduce the photocurrent of the thin film transistor 100 by more than about 30%.

Figure 6:
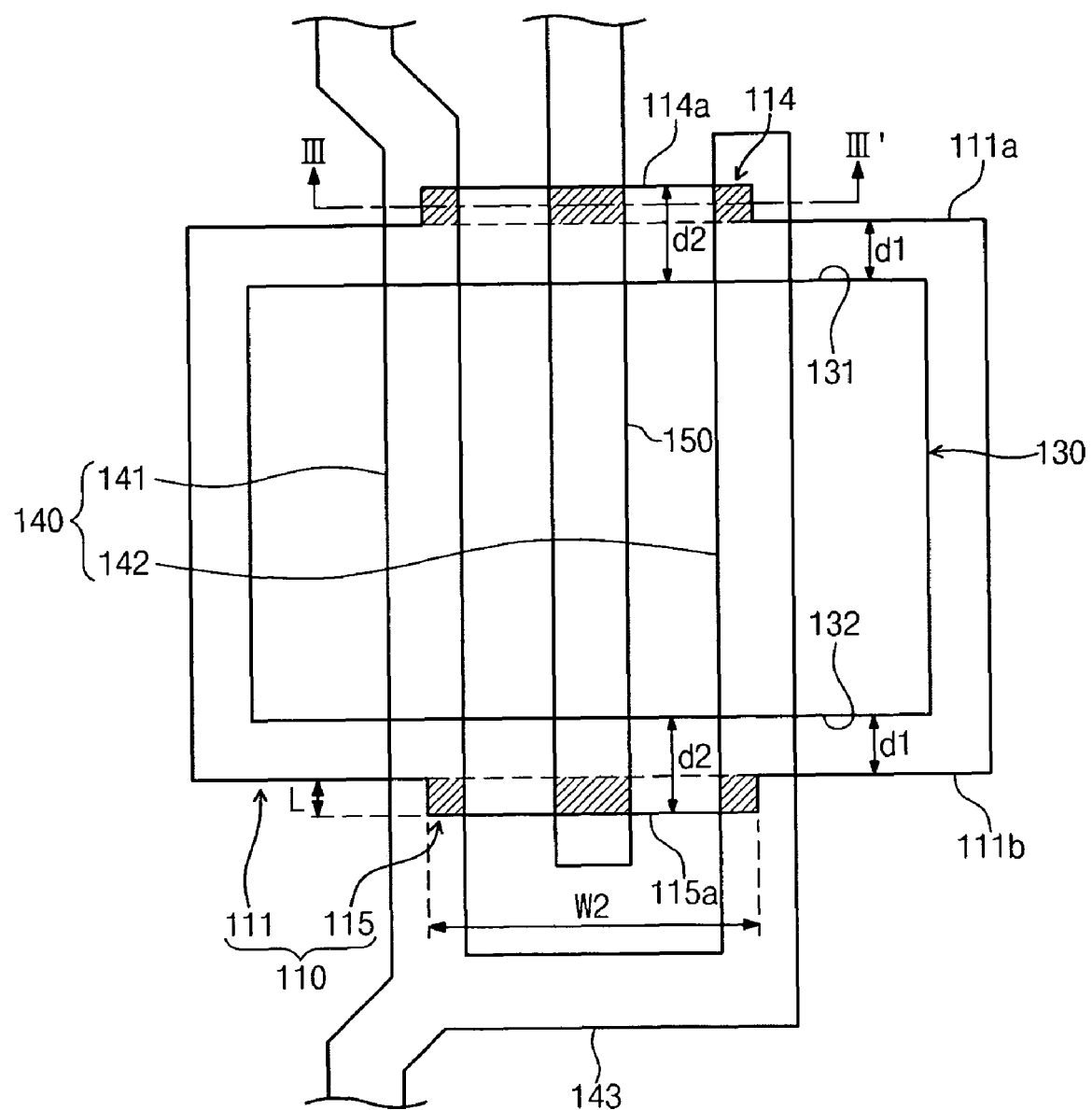
FIG. 6 is a plan view showing another exemplary embodiment of a thin film transistor according to the present invention.
Figure 7:
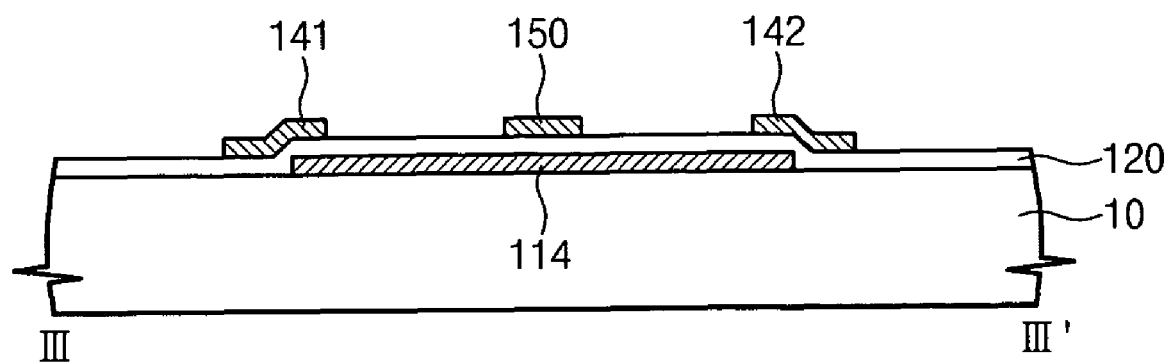
FIG. 7 is a sectional view taken along a line III-III' of FIG. 6.

FIG. 6 is a plan view showing another exemplary embodiment of a thin film transistor according to the present invention, and FIG. 7 is a sectional view taken along a line III-III' of FIG. 6. In FIGS. 6 and 7, the same reference numerals denote the same elements in FIGS. 1 and 2, and thus a detailed descriptions of the same elements is unnecessary.

Referring to FIGS. 6 and 7, a gate part 110 includes a third light blocking electrode 114 extended from a first side 111a of a gate electrode 111 and a fourth light blocking electrode 115 extended from a second side 111b of the gate electrode 111.

Each of the third and fourth light blocking electrodes 114 and 115 has a second width W2 that is smaller than the first width W1 of first and second light blocking electrodes 112 and 113 shown in FIG. 1. Thus, differing from the first and second light blocking electrodes 112 and 113 that are overlapped with the first and second source electrodes 141 and 142 in a cross shape, the third and fourth light blocking electrodes 114 and 115 are partially overlapped with the first and second source electrodes 141 and 142.

That is, in FIG. 1, a sum of the overlap area between the first light blocking electrode 112 and the first and second source electrodes 141 and 142 and the overlap area between the second light blocking electrode 113 and the first and second source electrodes 141 and 142 is greater by two times than an overlap area between the drain electrode 150 and the first and second light blocking electrodes 112 and 113. However, in FIG. 5, a sum of the overlap area between the third light blocking electrode 114 and the first and second source electrodes 141 and 142 and the overlap area between the fourth light blocking electrode 115 and the first and second source electrodes 141 and 142 is equal to or smaller than the overlap area between the drain electrode 150 and the first and second light blocking electrodes 112 and 113.

When the sum of the overlap area between the third light blocking electrode 114 and the first and second source electrodes 141 and 142 and the overlap area between the fourth light blocking electrode and 115 and the first and second source electrodes 141 and 142 decreases, a parasitic capacitance between the gate part 110 and the source part 140 of a thin film transistor 180 may decrease. When the parasitic capacitance between the gate part 110 and the source part 140 increases, a load in a data line (not shown) and a gate line (not shown) that are connected to the thin film transistor 180 increases, thereby causing a signal delay. Thus, when the width of the third and fourth light blocking electrodes 114 and 115 decreases, the load increase in the data line (not shown) and the gate line (not shown) may be prevented.

The photocurrent increases in the drain part 150 of the thin film transistor 180 as the horizontal distance between the semiconductor layer 130 and the edge of the gate part 110 adjacent to the semiconductor layer 130 decreases, however, no change is observed in the source part 140. Thus, although the width of the third and fourth light blocking electrodes 114 and 115 decreases and the sum of the overlap area between the third light blocking electrode 114 and the first and second source electrodes 141 and 142 and the overlap area between the fourth light blocking electrode 115 and the first and second source electrodes 141 and 142, the photocurrent does not increase in the source part 140.

Also, when the overlay difference of the first and second source electrodes 141 and 142 occurs, the sum of the overlap area between the third light blocking electrode 114 and the first and second source electrodes 141 and 142 and the overlap area between the fourth light blocking electrode 115 and the first and second is source electrodes 141 and 142 is not changed. Therefore, although the overlay difference occurs, the parasitic capacitance between the gate part 110 and the source part 140 of the thin film transistor 180 may be uniformly maintained.

Figure 8:
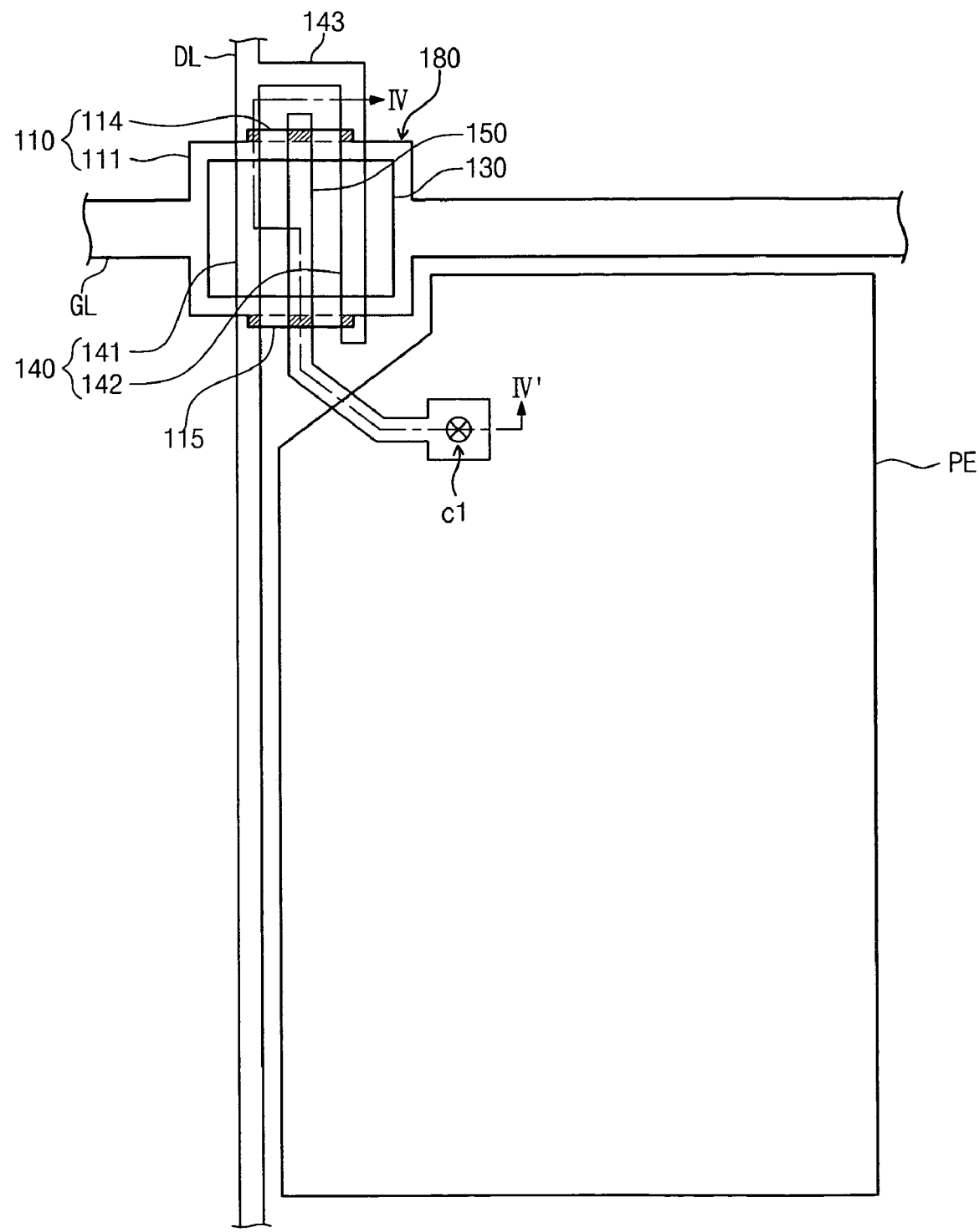
FIG. 8 is a plan view showing another exemplary embodiment of a display panel according to the present invention.
Figure 9:
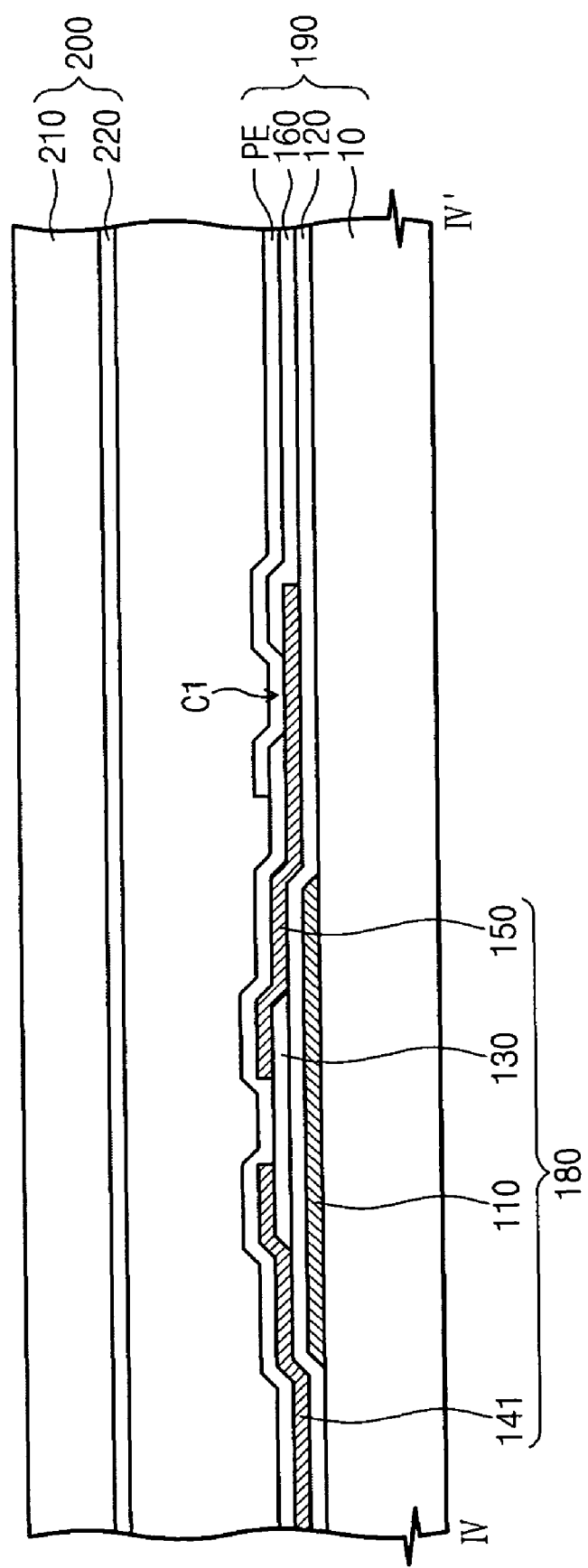
FIG. 9 is a sectional view taken along a ling IV-IV' of FIG. 8.

FIG. 8 is a plan view showing another exemplary embodiment of a display panel according to the present invention, and FIG. 8 is a sectional view taken along a ling IV-IV' of FIG. 7. In FIGS. 8 and 9, the same reference numerals denote the same elements in FIGS. 6 and 7, and thus a detailed description of the same elements is not necessary.

Referring to FIGS. 8 and 9, a display panel 300 includes an array substrate 190 and an opposite substrate 200 facing the array substrate 190. Although not shown in FIGS. 8 and 9, the display panel 300 may further include a liquid crystal layer interposed between the array substrate 190 and the opposite substrate 200.

The array substrate 190 includes a plurality of pixels arranged in a matrix configuration on a first base substrate 10. Since the pixels have the same circuit configuration, only one pixel among the pixels will be described in detail in FIGS. 7 and 8, and thus a detailed description of the other pixels is unnecessary.

The first base substrate 10 includes a data line DL and a gate line GL to define a pixel area in which a pixel is formed. The data line DL is intersecting with and insulating from the gate line GL. The pixel includes a thin film transistor 180 connected to the data line DL and the gate line GL and a pixel electrode PE connected to the thin film transistor 180.

Particularly, a gate part 110 of the thin film transistor 180 is branched from the gate line GL, a source part 140 of the thin film transistor 180 is branched from the data line DL. Also, a drain part 150 is formed on a protective layer 160 and is electrically connected to the pixel electrode PE through a contact hole that exposes the drain part 150.

As shown in FIG. 8, a drain electrode of the drain part 150, a first source electrode 141 and a second source electrode 142 of the source part 140 have an I-shape on the gate electrode 111 of the gate part 110. Thus, although an overlay difference of the drain electrode 150, the first and second source electrodes 141 and 142 occurs, a sum of an overlap area between the gate electrode 111 and the source part 140 and an overlap area between the gate electrode 111 and the drain part 150 is not changed. Consequently, the kickback voltage difference between pixels in the display panel 300 caused by the overlay difference may be prevented, and the brightness difference in the display panel 300 may be reduced.

Also, the gate part 110 includes a third light blocking electrode 114 and a fourth light blocking electrode 115 that are respectively extended from a first side 111a and a second side 111b (shown in FIG. 5) of the gate electrode 111 to prevent the light provided from the lower portion of the gate electrode 111 from being guided to the semiconductor layer 130 arranged on the gate electrode 111. When the drain electrode 150, the first source electrode 141, and the second source electrode 142 are extended to be intersected with the first and second sides 111a and 111b of the gate electrode 111, the light is easily guided to the semiconductor layer 130 in a region adjacent to the first and second sides 111a and 111b. Thus, the third light blocking electrode 114 and the fourth light blocking electrode 115 are formed at the first side 111a and the second side 111b of the gate electrode 111, respectively, thereby reducing the photocurrent of the thin film transistor 180, which is caused by the light.

As described in FIGS. 6 and 7, when the width of the third and fourth light blocking electrodes 114 and 115 is adjusted, the sum of the overlap area between the third light blocking electrode 114 and the first and second source electrodes 141 and 142 and the overlap area between the fourth light blocking electrode 115 and the first and second source electrodes 141 and 142 may be controlled. That is, when the width of the third and fourth light blocking electrodes 114 and 115 decreases, the sum of the overlap area between the third light blocking electrode 114 and the first and second source electrodes 141 and 142 and the overlap area between the fourth light blocking electrode 115 and the first and second source electrodes 141 and 142 decreases. Consequently, the parasitic capacitance between the gate part 110 and the source part 140 of the thin film transistor 180 is reduced, thereby preventing the kickback voltage of the pixel from increasing.

As shown in FIG. 9, the opposite substrate 200 includes a second base substrate 210 facing the first base substrate 10 and a common electrode 220 arranged on the second base substrate 210 and facing the pixel electrode PE. Although not shown in FIGS. 8 and 9, the opposite substrate 200 may further includes a color filter layer interposed between the second base substrate 210 and the common electrode 220. The color filter layer includes red, green, and blue color pixels.

According to the above, since the light blocking electrode extended from the gate electrode is formed on the gate part of the thin film transistor, the light provided from the lower portion of the gate electrode may be prevented from being guided to the semiconductor layer. Thus, the photocurrent of the thin film transistor may be reduced.

Also, since the source electrode and the drain electrode have the I-shape on the gate electrode, although the overlay difference occurs, the kickback voltage difference between pixels caused by the overlay difference in the display panel may be prevented.

As a result, the display panel employing the above-described thin film transistor may have an improved display quality.

Although the exemplary embodiments of the present invention have been described, it is understood that the present invention is not limited to these exemplary embodiments, and various changes and modifications can be made by one of ordinary skill in the art within the spirit and scope of the present invention as hereinafter claimed.

What is claimed is:

1. A thin film transistor comprising:
   a gate part including a gate electrode;
   a gate insulating layer covering the gate part;
   a semiconductor layer arranged on the gate insulating layer corresponding to a region in which the gate electrode is formed;
   a source part arranged on the semiconductor layer and intersecting with the gate electrode; and
   a drain part intersecting with the gate electrode, the drain part being spaced apart from the source part by a predetermined distance, and
   wherein the gate part further includes first and second light blocking electrodes that extend from first and second sides of the gate electrode, respectively, the first and second sides of the gate electrode are arranged in parallel with each other and extend in a first direction, and each of the first and second light blocking electrodes intersects with the source part and the drain part.

2. The thin film transistor of claim 1, wherein the source part comprises:
   a first source electrode and a second source electrode extending in a second direction that is substantially perpendicular to the first direction, and wherein the first and second source electrodes intersect with the first and second sides of the gate electrode and with the first and second portions of the light blocking electrode, the first and second source electrodes being spaced apart from each other by a predetermined distance; and
   a connecting electrode arranged in a peripheral area of the gate part to connect the first source electrode and the second source electrode.

3. The thin film transistor of claim 2, wherein a distance between a side of the semiconductor layer and a side of the light blocking electrode that is adjacent to and parallel with the side of the semiconductor layer is greater than a distance between the side of the semiconductor layer and a side of the gate electrode that is adjacent to and parallel with the side of the semiconductor layer, and further wherein the light blocking electrode blocks a light coming from a side of the gate electrode which is opposite the semiconductor layer from reaching the semiconductor layer.

4. The thin film transistor of claim 2, wherein the connecting electrode is spaced apart from the gate electrode and the light blocking electrode.

5. The thin film transistor of claim 2, further comprising pixel electrode, and wherein the drain part extends in the second direction and intersects with the first and second sides of the gate electrode and the first and second portions of light blocking electrode, and the drain part comprises a drain electrode electrically connected with the pixel electrode and positioned between the first source electrode and the second source electrode.

6. The thin film transistor of claim 5, wherein the drain electrode, the first source electrode, and the second source electrode are extended in parallel with each other, and further wherein each have an I-shape in a location intersecting the gate electrode.

7. The thin film transistor of claim 5, wherein the light blocking electrode has a width smaller than a length of the two sides of the gate electrode.

8. The thin film transistor of claim 7, wherein a sum of an overlap area between the light blocking electrode and the first source electrode and an overlap area between the light blocking electrode and the second source electrode is greater by two times than an overlap area between the light blocking electrode and the drain electrode.

9. The thin film transistor of claim 7, wherein a sum of an overlap area between the light blocking electrode and the first source electrode and an overlap area between the light blocking electrode and the second source electrode is equal to or smaller than an overlap area between the light blocking electrode and the drain electrode.

10. A thin film transistor comprising:
    a gate part including a gate electrode, and first and second light blocking electrodes that extend from first and second sides of the gate electrode, respectively, the first and second sides of the gate electrode being arranged in parallel with each other and extending in a first direction, the gate electrode further comprising third and fourth sides;
    a gate insulating layer covering the gate part;
    a semiconductor layer arranged on the gate insulating layer corresponding to a region in which the gate electrode is formed;
    a source part including at least one source electrode that is arranged on the semiconductor layer and extended longer than the third and fourth sides of the gate electrode in a second direction that is substantially perpendicular to the first direction, the source part overlapping the gate electrode, the first light blocking electrode, and the second light blocking electrode; and
    a drain part including a drain electrode that is arranged on the semiconductor layer and extended in the second direction for a distance longer than the third and fourth sides of the gate electrode and overlapping the gate electrode, the first light blocking electrode, and the second light blocking electrode, the drain electrode being spaced apart from the source electrode by a predetermined distance.

11. The thin film transistor of claim 10, wherein each of the first and second light blocking electrodes has a width that is smaller than a length of the two sides of the gate electrode.

12. The thin film transistor of claim 11, wherein a sum of an overlap area between the first light blocking electrode and the source electrode and an overlap area between the second light blocking electrode and the source electrode is greater by two times than a sum of an overlap area between the first light blocking electrode and the drain electrode and an overlap area between the second light blocking electrode and the drain electrode.

13. The thin film transistor of claim 11, wherein a sum of an overlap area between the first light blocking electrode and the source electrode and an overlap area between the second light blocking electrode and the source electrode is equal to or smaller than a sum of an overlap area between the first light blocking electrode and the drain electrode and an overlap area between the second light blocking electrode and the drain electrode.

14. A display panel comprising:
    a first base substrate;
    a plurality of data lines arranged on the first base substrate;
    a plurality of gate lines intersecting with the data lines to define a plurality of pixel areas;

a plurality of thin film transistors arranged in the pixel areas;

a plurality of pixel electrodes arranged in the pixel areas and connected to a corresponding thin film transistor; and a second base substrate facing the first base substrate, each thin film transistor comprising:

a gate part including a gate electrode;

a gate insulating layer covering the gate part;

a semiconductor layer arranged on the gate insulating layer corresponding to a region in which the gate electrode is formed;

a source part arranged on the semiconductor layer and overlapped with the gate electrode; and a drain part overlapped with the gate electrode and spaced apart from the source part by a predetermined distance, wherein the gate part further includes first and second light blocking electrodes that extend from first and second sides of the gate electrode, respectively, the first and second sides of the gate electrode are arranged in parallel with each other and extend in a first direction, and each of the first and second light blocking electrodes intersects with the source part and the drain part.

15. The display panel of claim 14, wherein the source part comprises:

a first source electrode and a second source electrode that are extended in a direction that is substantially perpendicular to the two sides of the gate electrode and allowed to be intersected with the gate electrode and the light blocking electrode, and the first and second source electrodes being spaced apart from each other in a direction that is substantially parallel with the two sides of the gate electrode by a predetermined distance; and a connecting electrode arranged in a peripheral area of the gate part to connect the first source electrode and the second source electrode.

16. The display panel of claim 15, wherein a horizontal distance between a side of the semiconductor layer and a side of the light blocking electrode that are adjacent to each other in parallel is greater than a horizontal distance between the side of the semiconductor layer and a side of the gate electrode that are adjacent to each other in parallel, and the light blocking electrode prevents a light provided from a lower portion of the gate electrode from being input to the semiconductor layer.

17. The display panel of claim 15, wherein the drain part comprises a drain electrode extended in the direction that is substantially perpendicular to the two sides of the gate electrode and allowed to be intersected with the gate electrode and the light blocking electrode, and the drain electrode being arranged between the first source electrode and the second source electrode.

18. The display panel of claim 17, wherein the light blocking electrode has a width that is smaller than a length of the two sides of the gate electrode.

19. The display panel of claim 18, wherein a sum of an overlap area between the light blocking electrode and the first source electrode and an overlap area between the light blocking electrode and the second source electrode is equal to or smaller than an overlap area between the light blocking electrode and the drain electrode.

20. The display panel of claim 17, wherein the first and second source electrodes are branched from a corresponding data line of the data lines, the gate electrode is branched from a corresponding gate line of the gate lines, and the drain electrode is electrically connected to a corresponding pixel electrode of the pixel electrodes.

* * * * *